(12) United States Patent
Ishikawa et al.

(10) Patent No.: US 8,011,562 B2
(45) Date of Patent: Sep. 6, 2011

(54) SOLDERING EQUIPMENT AND SOLDERING METHOD FOR ELECTRONIC COMPONENTS

(75) Inventors: Hisao Ishikawa, Mashiko-machi (JP); Masanori Yokoyama, Mashiko-machi (JP)

(73) Assignee: Nippon Joint Co., Ltd. (JP)

( * ) Notice: Subject to any disclaimer, the term of this patent is extended or adjusted under 35 U.S.C. 154(b) by 0 days.

(21) Appl. No.: 12/600,399

(22) PCT Filed: Aug. 29, 2009

(86) PCT No.: PCT/JP2008/066019
§ 371 (c)(1),
(2), (4) Date: Aug. 20, 2010

(87) PCT Pub. No.: WO2009/157099
PCT Pub. Date: Dec. 30, 2009

(65) Prior Publication Data
US 2011/0079633 A1    Apr. 7, 2011

(30) Foreign Application Priority Data
Jun. 23, 2008   (JP) .................................. 2008-186519

(51) Int. Cl.
   *B23K 31/02*   (2006.01)
(52) U.S. Cl. ......................... 228/201; 228/256; 228/260
(58) Field of Classification Search .................. None
   See application file for complete search history.

(56) References Cited

U.S. PATENT DOCUMENTS

| | | | | |
|---|---|---|---|---|
| 3,993,235 | A | * | 11/1976 | Boynton .......................... 228/37 |
| 4,598,858 | A | * | 7/1986 | Stratil et al. .............. 228/180.1 |
| 4,700,878 | A | * | 10/1987 | Ciniglio ........................... 228/37 |
| 4,724,994 | A | * | 2/1988 | Flury ........................... 228/56.2 |

(Continued)

FOREIGN PATENT DOCUMENTS

| | | |
|---|---|---|
| JP | H02-118003 | 5/1990 |
| JP | S50-40103 | 2/1993 |
| JP | 05-050286 | 3/1993 |

(Continued)

OTHER PUBLICATIONS

Machine translation of JP-2009-105356A (no date available).*

*Primary Examiner* — Kiley Stoner
(74) *Attorney, Agent, or Firm* — Husch Blackwell LLP

(57) ABSTRACT

A tin or solder alloy film is formed by ejecting molten tin liquid or molten solder alloy liquid in a jet state onto a copper surface of an electronic component. The overflowing molten tin or molten solder alloy liquid is transported to a stirrer. Then, cuprate and the like mixed in the overflowing molten tin or molten solder alloy liquid are taken in to the organic fatty acid solution by fiercely stirring and mixing the molten tin or molten solder alloy liquid in contact with a solution at a temperature of 180 to 350° C. containing 1 to 80 weight % of organic fatty acid having 12 to 20 carbon number that circulates in the stirrer to purify the overflowing molten tin or molten solder alloy liquid. The mixed solution is introduced into a reservoir of the organic fatty acid solution, and the purified molten tin solution or molten solder alloy liquid separated according to the specific gravity difference in the reservoir of the organic fatty acid solution is returned from the bottom of the organic fatty acid solution reservoir to the reservoir of the molten tin or molten solder liquid by a pump for circulation use. By means of this, copper is prevented from accumulating in the molten tin or molten solder liquid, and thus it is possible to continuously perform a stable soldering process for a long term.

4 Claims, 1 Drawing Sheet

U.S. PATENT DOCUMENTS

| | | | |
|---|---|---|---|
| 4,726,506 A * | 2/1988 | Kondo | 228/37 |
| 4,747,533 A * | 5/1988 | Lipschutz | 228/180.1 |
| 5,388,756 A * | 2/1995 | Howlett | 228/214 |
| 6,364,195 B1* | 4/2002 | Masuda et al. | 228/37 |
| 6,942,791 B1* | 9/2005 | Petrov et al. | 210/175 |
| 2002/0027157 A1* | 3/2002 | Takano et al. | 228/219 |
| 2003/0136816 A1* | 7/2003 | McDonald | 228/203 |
| 2004/0164131 A1* | 8/2004 | Watanabe | 228/261 |
| 2008/0093417 A1* | 4/2008 | Takaguchi et al. | 228/37 |
| 2009/0127319 A1* | 5/2009 | Ho | 228/209 |

FOREIGN PATENT DOCUMENTS

| | | |
|---|---|---|
| JP | H05-063349 | 3/1993 |
| JP | H08-037366 | 2/1996 |
| JP | 09-094688 | 4/1997 |
| JP | 11-077366 | 3/1999 |
| JP | 2001-237536 | 8/2001 |
| JP | 2001-320162 | 11/2001 |
| JP | 2006-045676 | 2/2006 |
| JP | 2007-532321 | 11/2007 |
| JP | 2009-105356 A * | 5/2009 |

* cited by examiner

[FIG.1]
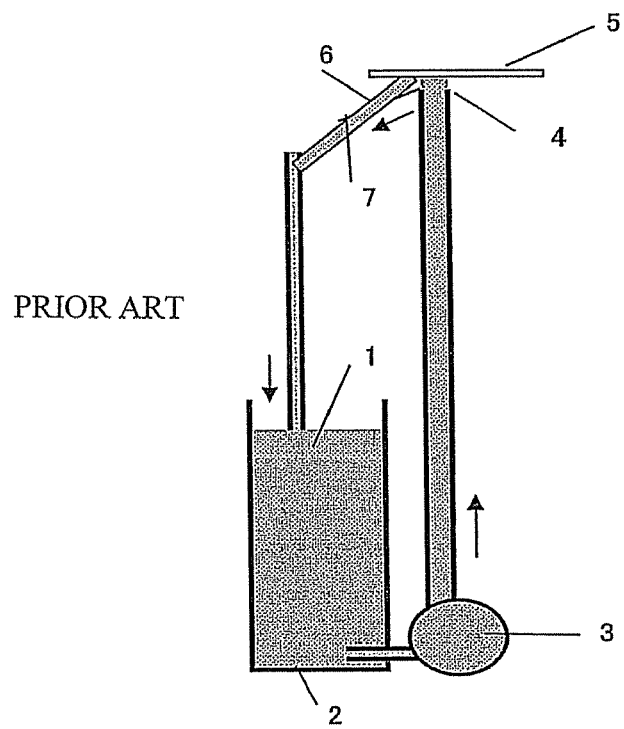
PRIOR ART
[FIG.2]
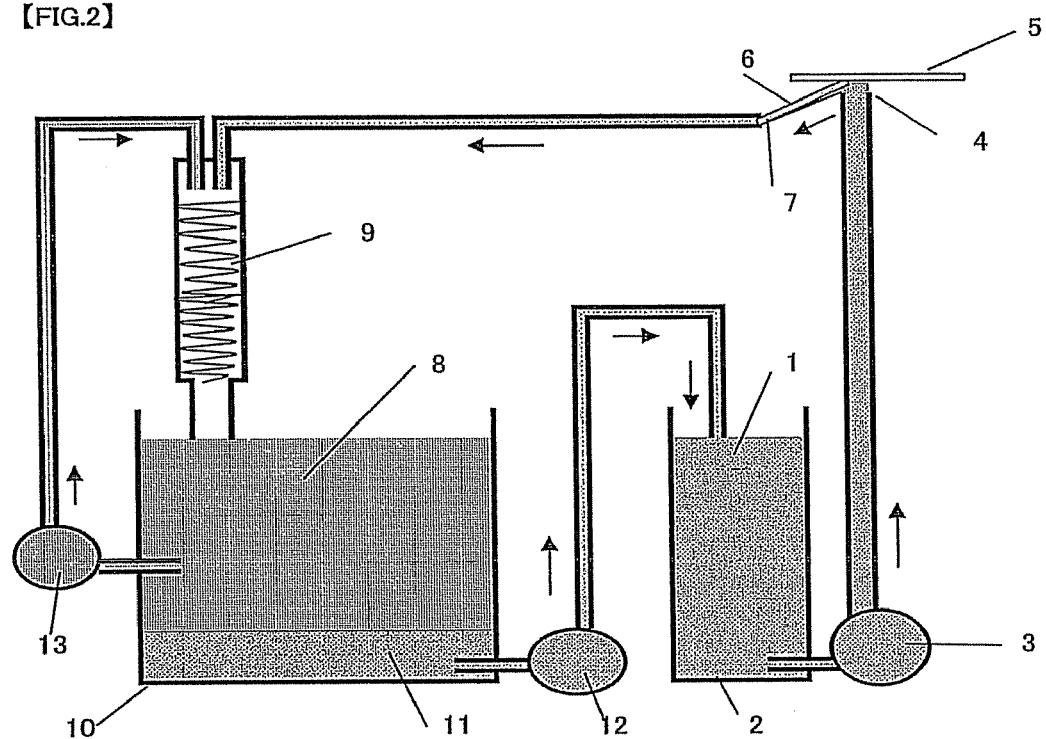

SOLDERING EQUIPMENT AND SOLDERING METHOD FOR ELECTRONIC COMPONENTS

TECHNICAL FIELD

The present invention relates to a equipment for jointing by covering with a tin or a solder alloy and a method for tin or solder plating by jetting molten tin or solder alloy onto a copper land surface or a copper and copper alloy lead surface in an electronic component such as a printed circuit board, a semiconductor package, and an electronic element. More particularly, the present invention relates to a technique and a equipment of preventing the copper concentration or impurity concentration of a molten tin liquid or solder alloy liquid getting higher with the passing of time due to copper oxide or flux components melted as impurities into the molten tin liquid or the solder alloy liquid circulated from a reservoir.

BACKGROUND ART

Recently, electronic devices are increasingly required to have high reliability and to be small and light. Electronic elements such as transistors, diodes, IC, resistors, and capacitors, electronic components such as connectors, and printed circuit boards are bonded with tin or solder to form an electronic circuit, which is widely used as a semiconductor device or an electronic device. In accordance with the reduction in size of these electronic elements, electronic components, and printed circuit boards, the solder bonding portion is getting minute and thus is required to have higher quality and reliability than ever. Particularly, extremely strict reliability is required in the quality of the minute solder bonding of printed circuit board and electronic elements.

For this reason, bonding strength is required also in the tin or solder alloy used for tin or solder bonding. Particularly, high reliability is required of a minute tin or solder bonding portion according to the miniaturization of pitch spacing and bonding area of the leads of electronic elements or electronic components.

On the other hand, recently, the prohibition or restriction of use of lead has been promoted due to problems of environmental pollution and harmful effects to the human body. Particularly, in the field of electronic components, so-called "lead-free solder alloy" containing no lead has been widely used in the soldering process. In particular, tin-silver-copper based solder alloy and solder alloy additionally added with antimony (Patent Document 1), solder alloy formed by adding nickel, germanium, and the like to tin-silver-copper based solder alloy (Patent Document 2) and the like have been proposed and put to practical use. In addition, various kinds of solder alloy have been proposed such as tin-zinc-nickel based solder alloy, and solder alloy additionally added with silver, copper, bismuth, and the like (Patent Document 3).

Generally, the method of bonding tin or solder alloy to a copper land surface or a copper and copper alloy lead surface of electronic components such as printed circuit boards, semiconductor packages, and electronic elements is as follows:

Tin or solder alloy is heated at a temperature equal to or higher than the melting point in a reservoir so that it is melted to get liquid. Then, the tin or solder liquid is supplied by a pump and jetted from a nozzle or a slit to the copper land or copper lead on the surface of a material such as a printed circuit board, electronic components or the like that is to be tin or solder bonded. The overflowing liquid is brought back to the original reservoir and is used in circulation.

However, at the time of soldering, flux or copper oxide film or the like on the surface of the copper land or the copper lead portion is mixed into the overflowing molten tin liquid or molten solder alloy liquid as impurities. This results in that the copper concentration or impurity concentration of the molten tin or the molten solder alloy liquid gets higher and higher with the passing of time. In addition, the solder composition changes, and not only the physical properties but also the chemical properties of the solder change.

Then, the solderability deteriorates particularly, and thus the solder forms with its greater volume than necessary so-called "excess volume" (horn, icicle) at the bonding portion. In a circuit having a small pitch spacing between leads, there are drawbacks such as that leaks easily occur through bridges formed toward adjacent leads. Besides, an outward phenomenon such as incomplete soldering occurs (Patent Document 4).

In addition, the elongation, which is one of the physical and mechanical characteristics of bonded solder, becomes smaller. Accordingly, after an electronic circuit is mounted on a semiconductor device or the like and repeatedly turned on and off, the solder bonding portion is fatigue-broken due to the heat cycle to easily cause conduction failure. It is widely known that this impairs the connection reliability of minute electronic devices.

Accordingly, after continuous soldering process, when the copper concentration exceeds a certain upper limit and the above-described solder characteristic deteriorates to cause an abnormal phenomenon (quality inferiority), it is common that the deteriorated solder is relatively frequently discarded and the renewed solder is used. That is, efficiency is extremely poor from the viewpoint of resources, workability, quality stability, and economy.

For this reason, particularly, as a method for improving efficiency by suppressing the increase of copper concentration at the time of the continuous process of the printed circuit board and the like, a method has been proposed and put to practical use in which a second solder which mainly contains an alloy excluding copper is supplied when molten solder liquid in a reservoir is lowered to a certain liquid level during the continuous process.

However, while this method can suppress the increase of copper to some extent, the increasing tendency with the passing of time does not change. Accordingly, the quality of solder bonding deteriorates with the passing of time. In addition, it is cumbersome to prepare and manage the second solder. Thus, despite a merit of extending the duration of use, the method is not quite sufficiently satisfactory (Patent Document 4).

Patent Document 1: Japanese Patent Application Laid-Open No. 5-50286 (Japanese Patent No. 3027441)
Patent Document 2: Japanese Patent Application Laid-Open No. 11-77366 (Japanese Patent No. 3296289)
Patent Document 3: Japanese Patent Application Laid-Open No. 9-94688 (Japanese Patent No. 3299091)
Patent Document 4: Japanese Patent Application Laid-Open No. 2001-237536 (Japanese Patent No. 32216709)

DISCLOSURE OF THE INVENTION

Problems to be Solved by the Invention

The invention is to provide a technical method and a equipment for dramatically improving the bonding reliability of minute bonding portions of minute electronic components. The objection of the invention is, in a equipment and a method for automatic circulation-jet soldering of a molten tin liquid or a molten solder liquid presently put to practical use, to prevent impurities such as flux or copper oxide from being mixed into the tin or solder alloy liquid and accumulating with the passing of time. By means of this, the invention is to solve the problem (horns, icicles) of the excess volume that occurs at the time of tin or solder bonding of the minute portion of a minute lead, narrow lead pitch circuit or the like, the problem of leaks to the adjacent lead caused by the solder bridge, the outward phenomena such as incomplete soldering, and the problem of conduction failure caused by fatigue breaking of the bonded portion with deterioration over time due to the repetitive heat cycle. Moreover, the invention is further to eliminate inefficiency from the viewpoint of resources, workability, quality stability, and economy that is attributed to the relatively frequent discard of the deteriorated solder and the use of the renewed solder.

Means for Solving the Problems

The equipment and the method of the invention make it possible to prevent the lot-to-lot deterioration of bonding quality with the passing of the time that occurs in continuous tin or solder process and thus to obtain products having stable, high bonding reliability with extremely small variabilities in bonding quality. In the equipment for bonding tin or solder alloy on a copper land surface or a copper and copper alloy lead surface of electronic components such as printed circuit boards, semiconductor packages, and electronic elements, as shown in FIG. 2, molten tin liquid or solder alloy liquid 1 is supplied from a reservoir 2 via a dedicated pump 3 and is jetted by a nozzle or slit 4 as a jet flow onto the copper land surface or the copper and copper alloy lead surface of the electronic components 5 to be tinned or soldered. The overflowing molten tin liquid or solder alloy liquid 6 is received by a guide launder 7 and is transported into a stirrer 9.

Meanwhile, a solution 8 at a temperature of 180 to 350° C. which contains 1 to 80 weight % of organic fatty acid having 12 to 20 carbon number is transported from a reservoir 10 into the stirrer 9 by a dedicated pump 13. The molten tin liquid or solder alloy liquid 6 overflowing in the stirrer comes into contact with the organic fatty acid solution 8, and they are fiercely stirred and mixed, thereby purifying the overflowing molten tin liquid or solder alloy liquid polluted by copper oxide and flux components existing on the copper land surface or copper and copper alloy lead surface of the electronic component bonded with the tin or solder alloy (At that time, oxides such as cuprate and tin oxide that have been originally in the molten tin liquid or solder alloy liquid, other oxide of added metal, and oxidized impurities such as iron, lead, silicon, and potassium mixed in tiny amounts are removed and purified by the organic fatty acid solution).

Then, the mixed liquid is introduced to the organic fatty acid solution reservoir 10, and the purified molten tin liquid or solder alloy liquid 11 separated in the organic fatty acid solution reservoir according to the specific gravity difference is returned from the bottom of the organic fatty acid solution reservoir to the lead-free solder liquid reservoir 2 by a pump 12.

By means of this, the increase of the copper concentration and impurity concentration in the circulated and jetted molten lead-free solder liquid with the passing of time is suppressed. Besides, impurities such as copper oxide and solder flux remainders are not put into the original solution reservoir. Therefore, change in the composition of the molten tin solution or molten solder solution in the reservoir with the passing of time is suppressed, and thus it becomes possible for tin or solder to continuously have stable, high bonding reliability for a long time for a large amount of electronic components and printed circuit boards.

More specifically, the organic fatty acid used in the invention can be that having 12 or less carbon number, but because of its water absorbability, it is not very preferable to use it at a high temperature.

In addition, the organic fatty acid having 21 or more carbon number has a high melting point, poor osmosis, and difficult handleability. Besides, the anticorrosive effect of the processed tin or solder alloy surface is insufficient.

Preferably, palmitic acid having 16 carbon number and stearic acid having 18 carbon number are the most suitable. By using a solution at a temperature of 180 to 350° C. including either of these by 1 to 80 weight % and ester synthetic oil for the rest, the solution selectively takes in impurities such as oxide and flux components existing in the overflowing molten tin liquid or molten solder alloy liquid, and thus the overflowing molten tin liquid or molten solder alloy liquid can be purified.

If the organic fatty acid concentration is 1 weight % or lower, this effect is low, and complete management is complex. In addition, if it is 80 weight % or higher, viscosity is significantly high, and problems of smoke evolution and foul odor occur at a high temperature range of 300° C. or higher. There is also a problem in stirring and mixing with the molten tin or solder alloy liquid. Accordingly, a concentration range of 5 to 60 weight % is preferable.

The liquid temperature depends on the melting point of the tin or solder alloy used. It is necessary to fiercely stir, contact, and mix the organic fatty acid solution and the molten tin liquid or solder alloy liquid in a high temperature range at least equal to or higher than the melting point.

The upper limit temperature is about 350° C. from the viewpoint of the concerns of smoke evolution or energy saving. Preferably, it is from a temperature equal to or higher than the melting point of the tin or solder alloy liquid used up to 300° C.

The reason for mixing in the ester synthetic oil is to lower the viscosity to allow the easy performance of the uniform stirring and mixing process, and to suppress the high-temperature smoke evolution property of the organic fatty acid. The concentration is determined by the organic fatty acid concentration.

As to the stirrer and the stirring method, the organic fatty acid and ester synthetic oil may be put into a stainless container provided with a heating device and heated to a predetermined temperature. They may be stirred and uniformly mixed using a batch type stainless impeller stirrer or the like. In that case, it is necessary to take a long stirring time to sufficiently mix for reaction.

Accordingly, preferably, a static mixer is the most suitable. When the static mixer is used, stirring and mixing are efficiently performed in a short time, and it is possible to efficiently remove impurities such as copper oxide or flux components in the overflowing molten tin liquid or molten solder alloy liquid, reaction products thereof, or the like.

The stirring time varies according to the input amount of the overflowing molten tin liquid or molten solder alloy liquid, the structure of the stirrer, and the stirring conditions. When the static mixer is used, stirring and mixing for 1 to 50 seconds suffice.

Then, when the stirred and mixed liquid is introduced into the reservoir of the organic fatty acid solution, it is naturally separated according to the difference in specific gravity into the purified molten tin liquid or molten solder alloy liquid in the bottom of the organic fatty acid reservoir (lower layer) and, as the upper layer, the organic fatty acid solution containing cuprate or tin oxide existing in the overflowing liquid that have been taken in a saponified state after reacted with the carbonyl group of the organic fatty acid, or the oxide of added metal, and a tiny amount of oxidized impurities such as iron, lead, silicon, potassium and the like.

In this state, the purified molten tin liquid or molten solder alloy liquid in the bottom (lower layer) is returned to the original reservoir for the molten tin liquid or molten solder alloy liquid by a pump. Then, it is supplied to a nozzle or slit by another pump for jetting out, and the overflowing liquid is circulated into a stirrer such as a static mixer. In the same manner, the organic fatty acid solution is circulated and supplied into a stirrer such as the static mixer by a dedicated pump.

As to the types of tin or solder alloy applicable to the invention, all tin or solder alloy generally used for bonding electronic components can be used. From the viewpoint of environmental problems and reliability in bonding, it is preferable to use tin or molten lead-free solder alloy that is composed mostly of tin and additionally added with any one or more of silver, copper, zinc, bismuth, antimony, nickel, and germanium. Particularly preferable are solder alloys including 1 to 3 weight % of silver, 0.1 to 1% of copper, 0.01 to 0.5% of nickel, and 0.001 to 0.02% of germanium.

ADVANTAGE OF THE INVENTION

When the solution including 1 to 80 weight % of the organic fatty acid having 12 to 20 carbon number and the ester synthetic for the rest at a temperature of 180 (temperature equal to or higher than the melting point of the lead solder alloy materials used) to 300° C., as well as the overflowing liquid of the common molten tin liquid or molten solder alloy liquid that are presently widely put to practical use are poured into a stirrer mixer such as the static mixer and are stirred and mixed, then impurities such as cuprate, tin oxide, and silver oxide that exists in the overflowing molten tin liquid or molten solder alloy liquid, or oxide of the other added metal, and a tiny amount of iron, lead, silicon, and potassium or the like that are mixed in react with carbonyl group of the organic fatty acid and are taken in to form saponification products. They are separated and removed from the overflowing liquid, and the overflowing liquid is purified. By leaving the stirred and mixed liquid introduced to the reservoir of the organic fatty acid solution, it naturally separates into the purified molten tin liquid or molten solder alloy liquid in the bottom of the reservoir (lower layer) and the organic fatty acid solution containing the impurities in the upper layer after a short time of about 1 minute according to the specific gravity difference (see FIG. 2).

Accordingly, the purified molten tin liquid or molten solder alloy liquid is returned from the bottom portion to the reservoir of the molten tin liquid or molten solder alloy liquid of the soldering equipment by the pump, then it is supplied to the nozzle or slit for tinning or soldering by another pump and jetted, and the overflowing solution is poured again into the stirrer such as a static mixer and is circulated and used.

By means of this, it is possible to prevent the lot-to-lot deterioration of bonding quality with the passing of time caused in continuous tinning or soldering process in the existing equipment. Therefore, it is possible to perform the long-term continuous process of tin or solder alloy bonding with a extremely small variabilities in bonding quality and high, stable bonding reliability.

In the soldering process of electronic components, and particularly multi-layered printed circuit boards including a number of through holes, the amount of solder bonded to the multi-layered printed circuit board is large. Therefore, in the continuous process, when the liquid level of the molten solder liquid in the reservoir falls to the lower limit level, it is necessary to supply a solder rod or a solder board.

On the contrary, in case of the invention, it is sufficient that the necessary amount of solder with the same composition as that in the initial step may be simply input. It is not necessary to prepare solder with low copper concentration to adjust the copper concentration increased by a continuous process as in the existing method, and it is not necessary to repeat frequent discard and renewal thorough initial make-up of electrolytic bath attributed to the deterioration of the solder bonding performance due to the significant increase of copper concentration. Accordingly, the equipment and the method of the invention are very efficient and industrially advantageous from the environmental viewpoints of resource saving and energy saving as well as the viewpoint of economy.

After checking the change of copper concentration and impurity concentration with the passing of time in the reserved liquid of the molten tin liquid or molten solder alloy liquid processed under the above-described conditions, it is perceived that the invention (Examples 1 and 2) has the following effects comparing to the Comparative Examples 1 and 2 or the presently widely used jet-circulation continuous automatic tinning or soldering equipment where the overflowing liquid is jetted and spouted onto targets to be soldered, then directly returned to the reservoir of the molten tin liquid or molten solder liquid, circulated and used again: While in the Comparative Examples 1 and 2, copper concentration and concentration of impurities such as flux components, reacted products, and metal oxide that are mixed in increase with the passing of time, the examples 1 and 2 of the invention clearly shows almost no change in the copper concentration in spite of continuous use for a long term. In addition, it turned out that there is an effect that concentration of the impurities decreases.

Moreover, there is almost no deterioration of solderability with the passing of time. Besides, solderability in soldering is much better, and viscosity when melted is low. Thus, these are the most suitable for the soldering of minute portions.

That is, according to the invention, even in a printed circuit with a very narrow pitch spacing having a lead area of 0.08 mmφ and an adjacent lead distance of 0.08 mm, there is no excess volume (horn, icicle), no leak to the adjacent lead caused by solder bridge, no partial incomplete soldering, and no conduction failure in the electronic circuit due to the fatigue breaking of the minute soldering portion through a heat cycle of high and low temperature. Accordingly, it is realized that the tin or solder bonding portion of the equipment and method according to the invention is excellent in long-term connection reliability.

BRIEF DESCRIPTION OF THE DRAWINGS

FIG. 1 is a schematic view illustrating an example of the existing circulation-jet automatic continuous soldering equipment for an electronic component.

FIG. 2 is a schematic view illustrating an example of a circulation-jet automatic continuous soldering equipment for an electronic component according to the invention.

DESCRIPTION OF REFERENCE NUMERALS AND SIGNS

1: MOLTEN TIN SOLUTION OR SOLDER ALLOY LIQUID
2: RESERVOIR OF MOLTEN TIN LIQUID OR SOLDER ALLOY LIQUID

3: TRANSPORT PUMP FOR MOLTEN TIN LIQUID OR SOLDER ALLOY LIQUID

4: NOZZLE OR SLIT FOR EJECTING MOLTEN TIN LIQUID OR SOLDER ALLOY LIQUID

5: PRINTED CIRCUIT BOARD OR ELECTRONIC COMPONENT

6: OVERFLOWING MOLTEN TIN LIQUID OR SOLDER ALLOY LIQUID AFTER JETTING AND SPOUTING (OVERFLOWING LIQUID)

7: METAL LAUNDER FOR RECEIVING OVERFLOWING LIQUID 6

8: ORGANIC FATTY ACID SOLUTION

9: STIRRER

10: RESERVOIR OF ORGANIC FATTY ACID SOLUTION

11: PURIFIED MOLTEN TIN LIQUID OR SOLDER ALLOY LIQUID

12: TRANSPORT PUMP FOR PURIFIED MOLTEN TIN LIQUID OR SOLDER ALLOY LIQUID 11

13: TRANSPORT PUMP FOR ORGANIC FATTY ACID SOLUTION 8

BEST MODE FOR CARRYING OUT THE INVENTION

Examples and Comparative Examples

First, as Comparative Example 1, an existing circulation-jet automatic continuous soldering equipment is shown in FIG. 1. In this equipment, lead-free solder alloy including silver of 2.5 weight %, copper of 0.5 weight %, and tin for the rest is put into the reservoir 2 and melted. The molten lead-free solder alloy liquid 1 is transported to a nozzle 4 by a pump 3. Then, the molten lead-free solder alloy liquid 1 is jetted and spouted from the nozzle to a copper land portion and a through hole portion on the surface of a narrow-pitched multi-layered (4-layer) printed circuit board 5 having a thickness of 0.6 mm, a width of 200 mm, a length of 150 mm, a lead area of 0.08 mm$\phi$, and an adjacent lead distance 0.08 mm. All of the overflowing solution 6 is received by a launder 7 and directly returned and circulated into the reservoir 2 to use continuously.

On the other hand, as Example 1 of the invention, an improved circulation-jet automatic soldering equipment is shown in FIG. 2. In this equipment, lead-free solder alloy having the same composition as that of Comparative Example 1, i.e. including 2.5 weight % of silver, 0.5 weight % of copper, and tin for the rest, is put into the reservoir 2 and melted. The molten lead-free solder alloy liquid 1 is transported to a nozzle 4 by a pump 3. Then, the molten lead-free solder alloy liquid 1 is jetted and spouted from the nozzle to a copper land portion and a through hole portion on the surface of the multi-layered printed circuit board 5 having the same kind and the same lot as those of Comparative Example 1.

The overflowing liquid 6 is all received by a launder 7. Then, the overflowing liquid and solution 8 including 5 weight % of palmitic acid and ester synthetic for the rest at a liquid temperature of 280° C. are transported from the upper part of a static mixer 9 to the inside of it, and both liquids are stirred and mixed in the static mixer.

The mixed liquid is introduced from the lower part of the static mixer into a palmitic acid solution reservoir 10. The molten lead-free solder liquid 11 accumulated at the bottom of the palmitic acid solution reservoir according to the specific gravity difference is returned to the original molten lead-free solder liquid reservoir 2 by a pump 12, circulated and continuously used. The palmitic acid solution 8 at the upper part of the palmitic acid solution reservoir is supplied to the upper part of the static mixer 9 by another pump 13, and it is circulated and continuously used.

Meanwhile, as Comparative Example 2, lead-free solder alloy including 2.5 weight % of silver, 0.5 weight % of copper, 0.01 weight % of nickel, 0.005 weight % of germanium, and tin for the rest is put into the reservoir 2 of the existing circulation-jet automatic soldering equipment shown in FIG. 1 that is the same as that of Comparative Example 1 and melted. The molten lead-free solder alloy liquid 1 is transported to the nozzle 4 by the pump 3. Then, the molten lead-free solder alloy liquid 1 is jetted and spouted from the nozzle to the copper land portion and the through hole portion on the surface of the multi-layered printed circuit board 5 of the same kind and of the same lot as those of Comparative Example 1. The overflowing liquid 6 is all received by the launder 7, directly returned to the reservoir 2, and circulated and continuously used.

On the contrary, as Example 2, lead-free solder alloy having the same composition as that of Comparative Example 2 i.e. including 2.5 weight % of silver, 0.5 weight % of copper, 0.01 weight % of nickel, 0.005 weight % of germanium, and tin for the rest is put into the reservoir 2 of the improved circulation-jet automatic continuous soldering equipment that is the same as that of Example 1 of the invention shown in FIG. 2 and is melted. The molten lead-free solder alloy liquid 1 is transported to the nozzle 4 by the pump 3. The molten lead-free solder alloy liquid 1 is jetted and spouted from the nozzle to the copper land portion and the through hole portion on the surface of the multi-layered printed circuit board 5 of the same kind and of the same lot as those of Comparative Example 1. The overflowing liquid 6 is all received by the launder 7. The overflowing liquid 6 and the solution 8 including 5 weight % of palmitic acid and the ester synthetic for the rest at a liquid temperature of 280° C. are transported from the upper part of the static mixer 9 to the inside of it, and both liquids are stirred and mixed in the static mixer. The mixed liquid is introduced from the lower part of the static mixer into the palmitic acid solution reservoir 10. The molten lead-free solder liquid 11 accumulated at the bottom of the palmitic acid solution reservoir according to the specific gravity difference is returned to the original molten lead-free solder liquid reservoir 2 by the pump 12, circulated and continuously used. The palmitic acid solution at the upper part of the palmitic acid solution reservoir is supplied to the upper portion of the static mixer 9 by another pump 13, and it is circulated and continuously used.

With respect to the change of copper concentration and impurity concentration with the passing of time in the lead-free solder of the Comparative Examples and Examples, quantitative analysis is performed by an ICP light emission spectrometer (manufactured by Shimadzu Corporation, 7500 type) by sampling from solder liquid reservoir before the continuous use (initial state, blank), after the passed amount i.e. the number of soldering-processed printed circuit boards has reached 50,000, and after the number reached 100,000.

Similarly, with respect to solderability, a zero cross time is measured after performing a test 4 times (n=4) according to a solderability test method using a meniscograph, by sampling from solder solution reservoir before the continuous use, after the passed amount i.e. the number of soldering-processed printed circuit boards has reached 50,000, and after the number reached 100,000. At that time, pure copper lines of 0.4 mm$\phi$ are used as metering pins.

As a physical and mechanical evaluation method, sampling is performed from solder solution reservoir before the continuous use, after the passed amount i.e. the number of soldering-processed printed circuit boards has reached 50,000, and after the number reached 100,000. Each of the test pieces is prepared by using a stainless (SUS 304) casting mold (JIS No. 6) to have distance between evaluation points of L=50 mm, a diameter of 8 mmφ, chucking portion lengths of L=20 mm, and a diameter of 10 mmφ. The test measurement is performed twice (n=2) at a loading rate of 5 mm/min at a room temperature of 25° C. using a tensile strength tester (AG100 type) produced by Shimadzu Corporation according to a test method of "JIS Z 4421".

The result thereof is shown below in Table 1. In the characteristic values before the continuous use, there is no significant difference between Example 1 and Comparative Example 1 as well as between Example 2 and Comparative Example 2. However, after the continuous passed amount of the processed printed circuit boards has reached 50,000 and 100,000 in Comparative Example 1 and Comparative Example 2, copper concentration increases significantly, solderability deteriorates, physical and mechanical characteristic values i.e. elongation becomes smaller, harder and weaker with the passing of time. In addition, it is realized that excess volume (horn, icicle), solder bridge (leak) and incomplete soldering occur at various parts.

On the contrary, in Example 1 and Example 2 of the invention, there is hardly any increase of copper concentration even after the continuous passed amount of the processed printed circuit boards has reached 50,000 and 100,000, and, conversely, solderability gets better. As to the physical and mechanical characteristic values, elongation becomes slightly larger. However, no excess volume (horn, icicle), no solder bridge (leak) and no incomplete soldering occur. The iron impurity concentration decreases, and among the physical and mechanical characteristics, the elongation becomes slightly larger.

TABLE 1

Evaluation Result 1 of Examples and Comparative Examples, Before Continuous process (Blank)

| | | Concentration in Solder | | | Solderability | | Maximum | Tensile | Growth | Fe |
|---|---|---|---|---|---|---|---|---|---|---|
| | | Cu wt % | Ag wt % | Ni wt % | (Zero-Cross Time) sec | Soldering Appearance | Load kN | Strength Mpa | Ratio % | Concentration ppm |
| Before Continuous Use Start | Ex. 1 | 0.48 | 2.46 | | 0.2 0.2 | ○ Good | 2.56 | 57.7 | 23.5 | 97 |
| | | 0.49 | 2.45 | | 0.3 0.2 | | 2.80 | 56.4 | 23.2 | 110 |
| | Ex. 2 | 0.49 | 2.46 | 0.01 | 0.1 0.3 | ○ Good | 2.73 | 58.3 | 24.7 | 102 |
| | | 0.49 | 2.46 | 0.01 | 0.2 0.2 | | 2.69 | 57.2 | 23.7 | 89 |
| | Comp. 1 | 0.49 | 2.45 | | 0.2 0.3 | ○ Good | 2.77 | 52.6 | 23.9 | 111 |
| | | 0.47 | 2.46 | | 0.3 0.2 | | 2.87 | 56.5 | 23.0 | 93 |
| | Comp. 2 | 0.48 | 2.46 | 0.01 | 0.2 0.3 | ○ Good | 2.69 | 57.3 | 23.7 | 98 |
| | | 0.48 | 2.44 | 0.01 | 0.2 0.2 | | 2.90 | 57.9 | 25.6 | 104 |
| After Continuously Producing 50,000 Sheets | Ex. 1 | 0.49 | 2.46 | | 0.2 0.1 | ○ Good | 2.72 | 58.7 | 29.4 | 44 |
| | | 0.51 | 2.46 | | 0.2 0.2 | | 2.83 | 56.0 | 32.2 | 32 |
| | Ex. 2 | 0.48 | 2.46 | 0.01 | 0.3 0.2 | ○ Good | 2.90 | 52.5 | 28.3 | 19 |
| | | 0.50 | 2.45 | 0.01 | 0.3 0.2 | | 2.78 | 53.3 | 33.5 | 36 |
| | Comp. 1 | 0.72 | 2.45 | | 2.8 4.1 | x sporadic | 2.78 | 56.9 | 21.1 | 105 |
| | | 0.76 | 2.46 | | 2.4 3.3 | Horn, Leak Incomplete soldering | 2.77 | 57.5 | 20.6 | 123 |
| | Comp. 2 | 0.78 | 2.44 | 0.01 | 4.3 2.5 | x sporadic | 2.96 | 57.3 | 22.5 | 103 |
| | | 0.79 | 2.44 | 0.01 | 3.4 2.3 | Horn, Leak Incomplete soldering | 2.51 | 54.3 | 20.9 | 98 |
| After Continuously Producing 100,000 Sheets | Ex. 1 | 0.53 | 2.46 | | 0.2 0.3 | ○ Good | 2.74 | 56.9 | 31.5 | 35 |
| | | 0.53 | 2.46 | | 0.3 0.2 | | 2.89 | 53.6 | 29.9 | 16 |
| | Ex. 2 | 0.52 | 2.46 | 0.01 | 0.2 0.3 | ○ Good | 2.69 | 54.2 | 38.3 | 18 |
| | | 0.49 | 2.45 | 0.01 | 0.3 0.3 | | 2.77 | 56.3 | 41.7 | 27 |
| | Comp. 1 | 0.91 | 2.46 | | 5.5 4.8 | x multiple | 2.79 | 56.3 | 19.1 | 99 |
| | | 0.89 | 2.44 | | 4.4 3.9 | Horn, Leak Incomplete soldering | 2.87 | 55.5 | 17.2 | 115 |
| | Comp. 2 | 0.98 | 2.45 | 0.01 | 5.1 5.1 | x multiple | 2.79 | 55.9 | 17.5 | 107 |
| | | 0.96 | 2.46 | 0.01 | 3.8 5.3 | Horn, Leak Incomplete soldering | 2.93 | 52.2 | 18.9 | 119 |

As described above, the technology according to the invention clearly provides high elongation and high toughness which the existing lead-free solder alloy has not had. Particularly, the risk of breakdown of the bonding caused by the fatigue due to the repetitive heat cycle at the bonding portion with a minute area is low. Thus, it is possible to secure the long-term high reliability of the soldering of the miniaturized electronic device, which is of industrially high value.

The invention claimed is:
1. A method of tinning or soldering for bonding tin or solder alloy on a surface of a copper land portion or a surface of a copper and copper alloy lead portion of an electronic component, the soldering method comprising:
   forming a tin or solder alloy film by ejecting molten tin liquid or molten solder alloy liquid in a reservoir in a jet state onto the surface of the copper land portion or the surface of the copper and copper alloy lead portion of the electronic component to be solder-bonded by a nozzle or a slit;
   transporting the overflowing molten tin liquid or molten solder alloy liquid to a stirrer;

taking in a pollutant into an organic fatty acid solution by stirring and mixing the molten tin or molten solder alloy liquid in contact with the organic fatty acid solution at a temperature of 180 to 350° C. consisting of 1 to 80 mass % of organic fatty acid having 12 to 20 carbon number and ester synthetic oil for the rest that circulates in the stirrer to purify the molten tin liquid or molten solder alloy liquid;

introducing the mixed liquid into an organic fatty acid solution reservoir; and returning a purified molten tin liquid or molten solder alloy liquid that is separated in the organic fatty acid solution reservoir according to a specific gravity difference from a bottom of the organic fatty acid solution reservoir to the reservoir of the molten tin liquid or molten solder liquid by a pump for circulation use.

2. The method of tinning or soldering for an electronic component according to claim 1, wherein the organic fatty acid to be used is either palmitic acid or stearic acid.

3. The method of tinning or soldering for an electronic component according to claim 1, wherein the molten tin or solder alloy liquid to be used is molten lead-free solder alloy composed mostly of tin and added with one or more kinds of metal of silver, copper, zinc, bismuth, antimony, nickel, and germanium.

4. The method of tinning or soldering for an electronic component according to claim 1, wherein the stirrer is a static mixer.

* * * * *